United States Patent [19]

Hoff et al.

[11] Patent Number: 4,978,905
[45] Date of Patent: Dec. 18, 1990

[54] NOISE REDUCTION OUTPUT BUFFER

[75] Inventors: David Hoff, San Jose; Saroj Pathak, Los Altos Hills, both of Calif.

[73] Assignee: Cypress Semiconductor Corp., San Jose, Calif.

[21] Appl. No.: 429,722

[22] Filed: Oct. 31, 1989

[51] Int. Cl.$^5$ .............................................. G05F 3/24
[52] U.S. Cl. .................................. 323/314; 323/315; 323/317; 323/907; 307/304; 307/296.8
[58] Field of Search ............... 323/311, 312, 313, 314, 323/315, 316, 317, 351, 907; 307/304, 308, 310, 296.6, 296.8

[56] References Cited

U.S. PATENT DOCUMENTS

| | | | |
|---|---|---|---|
| 4,636,983 | 1/1987 | Young et al. | 365/181 |
| 4,714,901 | 12/1987 | Jain et al. | 323/315 |
| 4,723,108 | 2/1988 | Murphy et al. | 323/315 |
| 4,727,309 | 2/1988 | Vajdic et al. | 323/315 |
| 4,835,487 | 5/1989 | Doyle et al. | 323/315 |

Primary Examiner—Peter S. Wong
Attorney, Agent, or Firm—Blakely, Sokoloff, Taylor & Zafman

[57] ABSTRACT

A circuit for compensating for MOS device response to supply voltage variations, as well as temperature and process variations, in an integrated circuit device. The compensation circuit produces a reference voltage which modulates the gate bias voltage of a MOS transistor such that the gate-to-source bias of the MOS transistor is varied to compensate for variations in the supply voltage as well as for variations in the temperature and manufacturing process. The circuit pulls up the reference voltage toward the supply voltage as the supply increases, thereby increasing the gate drive on the MOS transistor. The circuit provides compensation for both AC and DC supply variations. The MOS transistor is used to modulate the available current sinking capability in an IC device output buffer, such that as the MOS gate drive increases, the current sinking capability is reduced, thereby slowing the output state transitions as the supply increases, and reducing noise caused by supply variations.

12 Claims, 3 Drawing Sheets

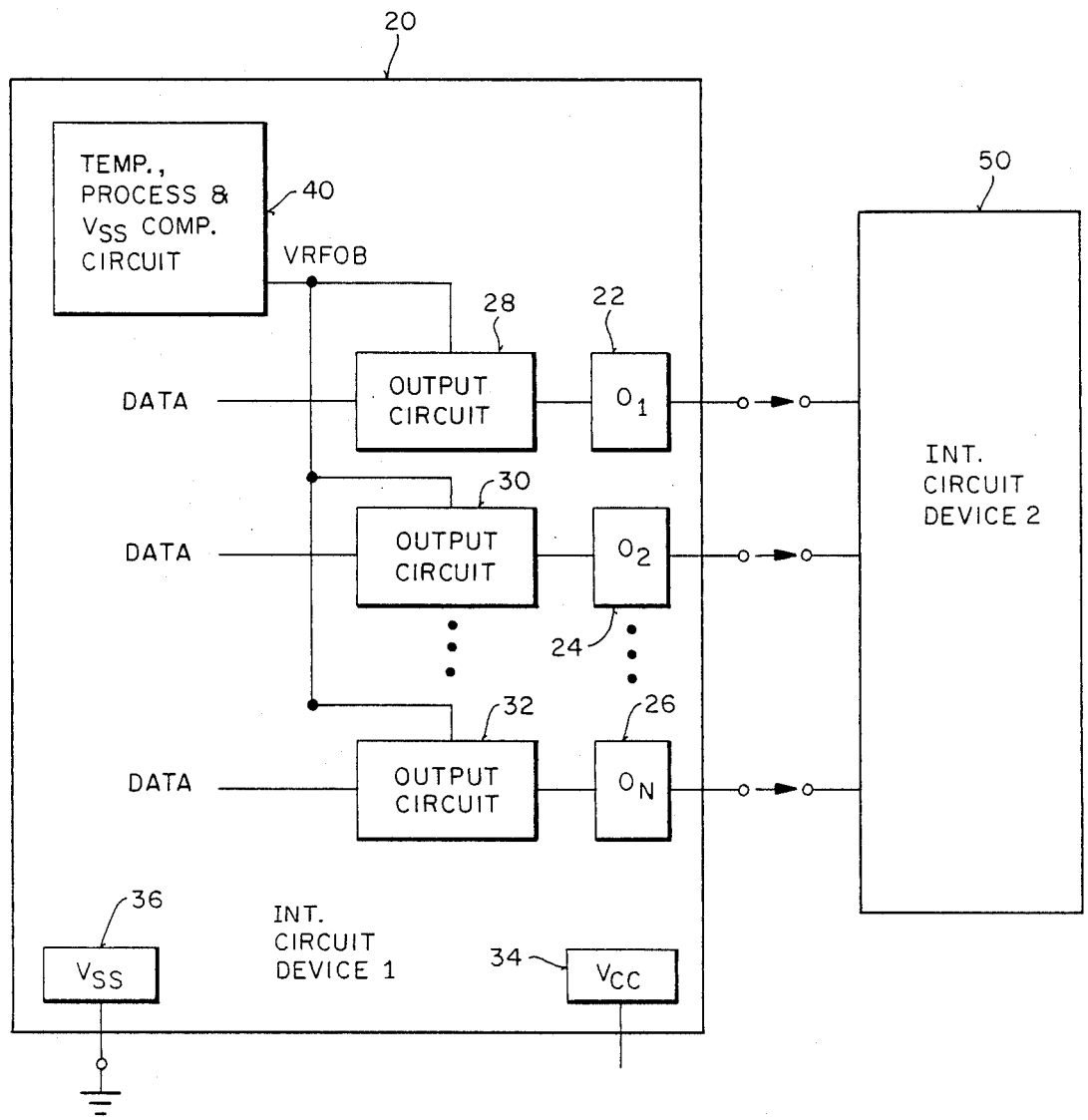
FIG_1
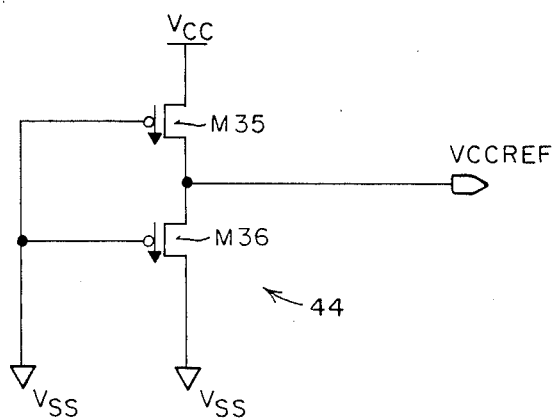
FIG_3

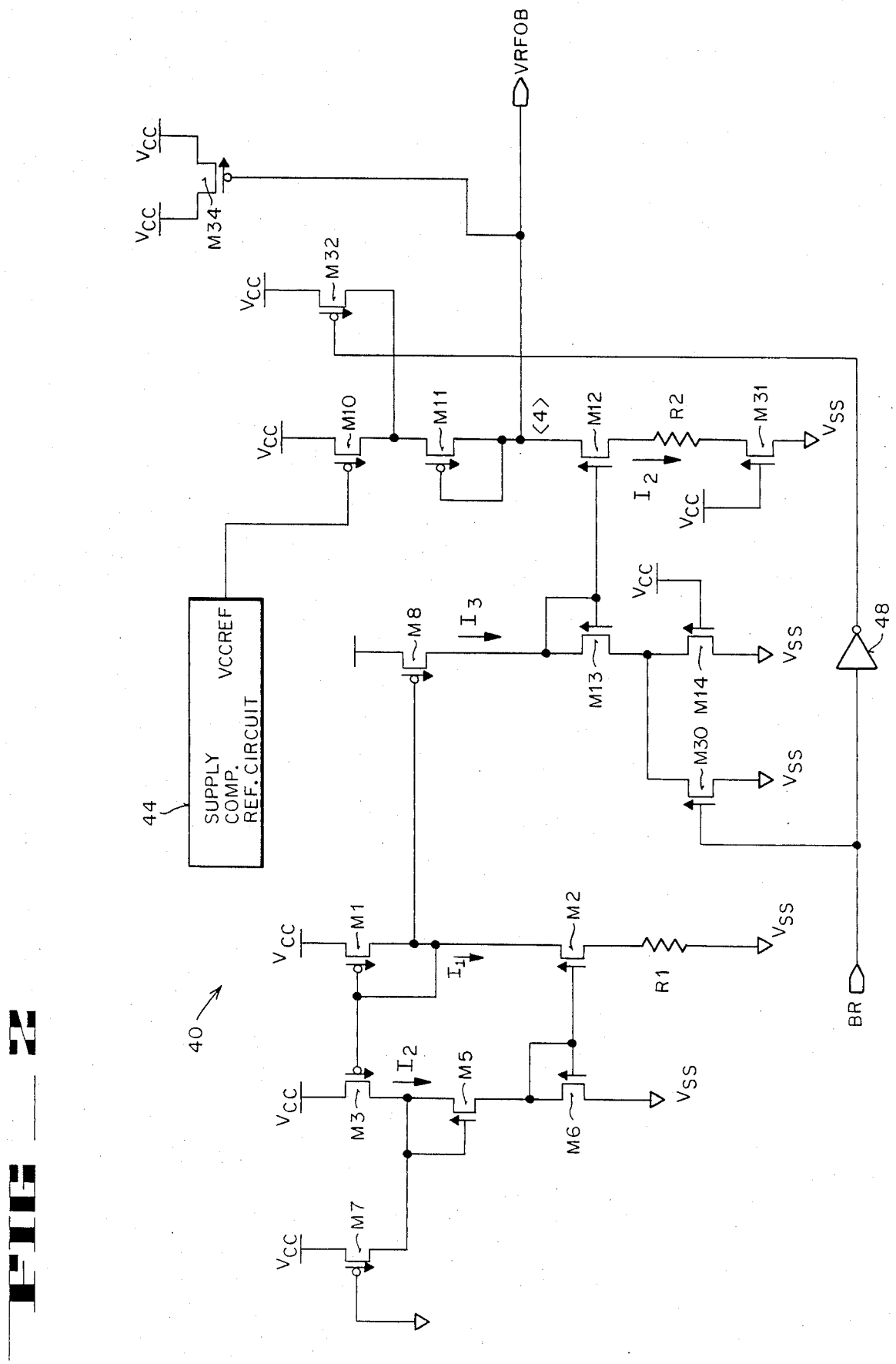
FIG—2

NOISE REDUCTION OUTPUT BUFFER

BACKGROUND OF THE INVENTION

The present invention related to the field of integrated circuit devices, and in particular to output circuits for such devices.

Many integrated circuit devices are characterized by one or more output terminals which provide device output signals which drive other components of the particular system in which the integrated circuit is installed. Output buffer signal transitions generate large current changes, which can result in voltage variations on supply pins. Inductance present in packages and boards results in on-die power supply oscillations and glitches. These supply variations can cause functional failures and access time push outs.

A difficult noise/speed tradeoff occurs due-to manufacturing process variations, supply and temperature variation. On extreme process, supply and temperature corners, output drive current can vary by well over 200%. This results in significant noise in the fast process corner, with slow output transitions in the slow process corner.

It is known to provide compensation for process variations and the effects of temperature variation in output buffer circuits. Circuits which provide such compensation in an output buffer circuit are described in U.S. Pat. No. 4,723,108, assigned to a common assignee with the present invention. However, while the circuits described in this patent provide some intrinsic first order compensation for supply voltage variations, significantly greater compensation for such variations would be desirable.

U.S. Pat. No. 4,636,983, assigned to a common assignee with the present invention, describes a memory circuit (FIG. 6) which includes some compensation for process, temperature and supply variations which assist in proper sensing operation.

SUMMARY OF THE INVENTION

The invention comprises a compensation circuit for compensating for supply voltage variations in an MOS integrated circuit device which is characterized by at least one output circuit which drives an output terminal with an output signal. The compensation circuit includes circuit means for generating a supply compensation signal and a reference voltage signal. The supply compensation signal is substantially fixed and does not increase with the supply. The reference signal varies in dependence on the supply voltage, such that the reference voltage signal rises as the supply voltage rises, and drops as the supply voltage drops. The circuit means is responsive to the supply compensation signal and the supply voltage to vary the gate drive on an MOS transistor device.

The compensation circuit further includes output circuit current modulating means responsive to the reference signal for modulating the current sinking capability of the output circuit. The modulating circuit functions to reduce the current sinking capability as the reference signal increases and thereby reduced the output circuit state switching speed, and conversely increases the current sinking capability as the reference signal decreases, thereby increasing the output circuit state switching speed. This provides compensation for slowly varying changes in the supply voltage.

The compensation circuit can further include a circuit means for compensating for rapidly changing supply voltage conditions. This comprises means for capacitively coupling the supply to the reference node at which the reference voltage signal is established, whereby as the supply voltage changes, the reference voltage changes with it.

The compensation circuit can further include a circuit means operable to significantly reduce the output circuit switching speed, particularly useful in special high noise sensitivity conditions, such as during high voltage programming or testing conditions.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 1 is a simplified schematic of a generalized integrated circuit device employing the invention.

FIG. 2 is a circuit schematic illustrative of a preferred embodiment of a compensation circuit for generating a reference potential for compensating an output buffer circuit for variations in temperature, process and supply voltage.

FIG. 3 is a circuit schematic illustrative of the supply compensation reference circuit employed in the circuit of FIG. 2.

DETAILED DESCRIPTION OF THE PREFERRED EMBODIMENT

Figure 4:
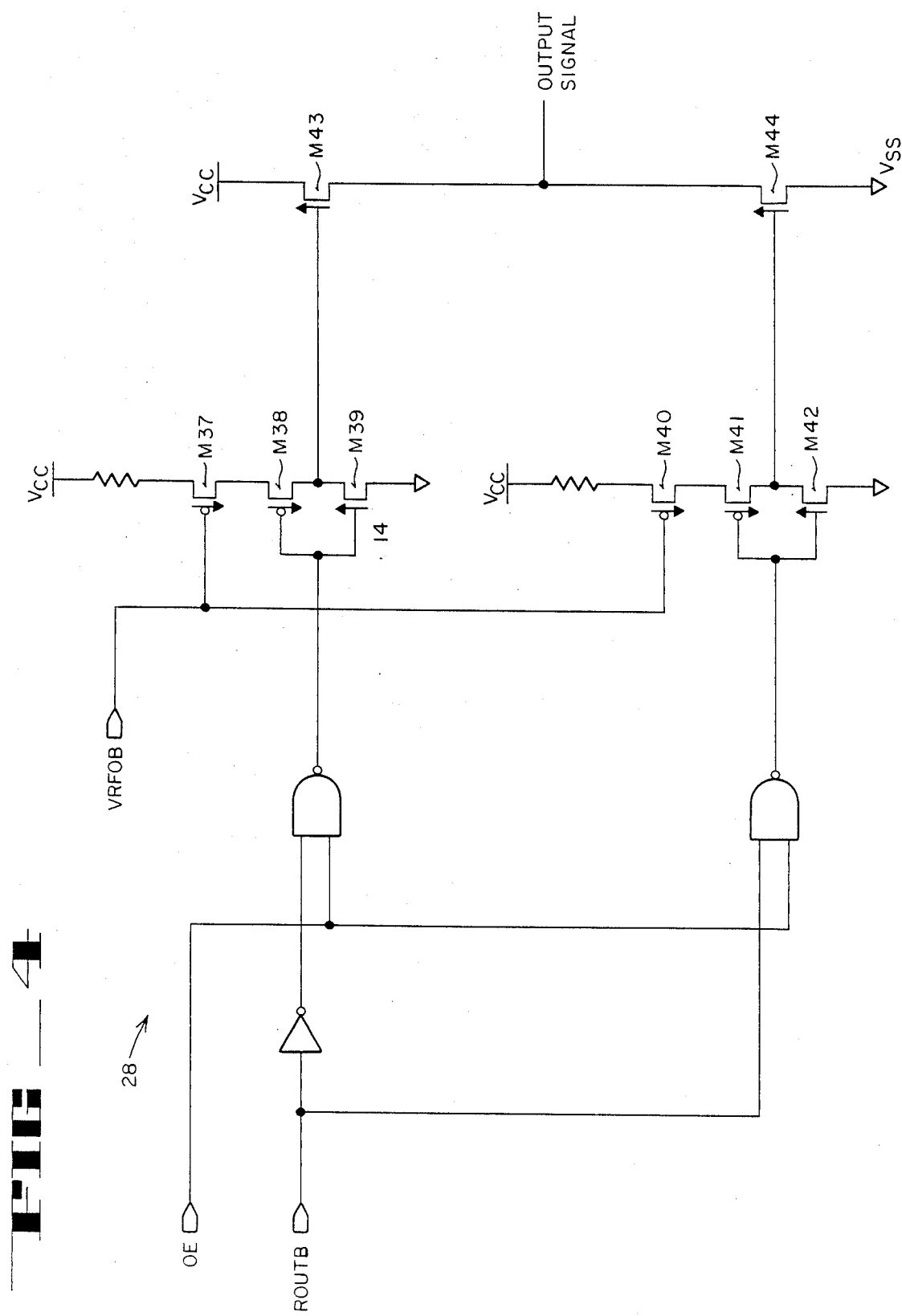
FIG. 4 is a circuit schematic illustrative of an output circuit employing the compensation signal generated in accordance with the invention.

In the following description, numerous specific details, such as schematic diagrams, voltages, etc. are set forth to provide a thorough understanding of the invention. However, it will be apparent to those skilled in the art that the invention may be practiced without the use of these specific details. In other instances, well-known circuits are shown in block diagram form in order not to obscure the present invention in unnecessary detail.

A generalized integrated circuit device includes one or more output terminals and circuits for driving the output terminals with the output terminal signals. Thus, as shown in FIG. 1, the integrated circuit device 20 includes a plurality of output terminals 22, 24, and 26, each respectively driven by a corresponding driver and buffer output circuit 28, 30 and 32. The positive supply voltage $V_{cc}$ for the device 20 is supplied externally via terminal 34, and for this embodiment is nominally +5 volts. The $V_{ss}$ terminal 36 is maintained at ground. Of course, other voltages may be utilized for $V_{cc}$ and $V_{ss}$.

The output signals from the integrated circuit device 20 are used in a typical system to provide input signals to one or more other integrated circuit devices, such as the device 50, present in the particular system in which the device 20 is installed. Of course, the device 20 typically includes other terminals which receive other signals, such as data input signals, and if the device 20 is a memory device, address signals. These other terminals and other circuitry comprising the device 20 are not illustrated in FIG. 1 in order not to obscure the invention with unnecessary detail.

A compensation circuit 40 is provided in accordance with the invention to provide a compensation signal VRFOB which is employed by the output circuits 28, 30 and 32 to provide circuit compensation against variations in temperature, process or manufacturing tolerances, and the supply potential $V_{cc}$. The compensation circuit 40 is illustrated in further detail in FIG. 2. The circuit 40 comprises a plurality of n-channel and p-channel MOS transistors. The n-channel transistors are illustrated as shown by transistor M2 of FIG. 2. The p-channel transistors are illustrated as shown by transistor M1 of FIG. 2. Thus, transistors M1, M3, M7, M8, M10, M11, and M32–33 are p-channel transistors. Transistors M2, M6, M12–M14, M30 and M31 of FIG. 2 are n-channel transistors. All the transistors in the embodiment shown herein are enhancement mode devices.

In the normal use of the invention, $V_{cc}$ is nominally at +5 volts, although, of course, other voltages may be utilized. Depending on system and circuit conditions, however, $V_{cc}$ can experience considerable variations, such that the actual $V_{cc}$ in some typical applications can vary from between 4 volts to 6 volts. As will be described below, the circuit 40 provides compensation for such variations in the supply voltage level.

The circuit 40 functions such that at lower temperatures VRFOB increases. This increase in VRFOB compensates for mobility variations due to temperature variations experienced by the integrated circuit device. Further, the circuit 40 senses process of manufacturing variations such that if the device 20 operates faster due to process variations, VRFOB is increased.

The manner in which the circuit 40 achieves the function of compensating for temperature and process variations is very similar to that described in U.S. Pat. No. 4,723,108 (the '108 patent), the entire contents of which are incorporated herein by this reference. The same device designations have been used in FIG. 2 as are used in the '108 patent to refer to corresponding devices. Because the operation of the circuit elements to achieve temperature and process (i.e. manufacturing tolerance) compensation has been described in the '108 patent, the description is not repeated here. In a general sense, it may be said that the circuits described in the '108 patent modulate the current I2 and establish a reference voltage used to set the gate drive on an MOS transistor (M15 in FIGS. 2 and 3 of the '108 patent). The reference voltage is adjusted to compensate for the process and temperature variations. The resistor R1 is particularly useful for reducing sensitivity to process variations, since diffusion-based resistors typically show minimal process shift.

In the circuit of the '108 patent, the gate of M10 MOS transistor device is connected to $V_{ss}$, i.e. ground potential. In accordance with the present invention, the reference voltage is further modulated to provide compensation for variations in the supply voltage $V_{cc}$. This is accomplished by connecting the gate of M10 to a supply compensation potential set by a supply compensation circuit 44, as will be described below, by adding an MOS device M34 between $V_{cc}$ and node 4 to act as a capacitor to compensate for rapid changes in $V_{cc}$, and by adding an MOS device M31 in the pull-down path for VRFOB.

FIG. 3 illustrates a schematic of the supply voltage compensation circuit 44. The circuit comprises two p-channel transistors M35 and M36. The drain of M35 is connected to the supply $V_{cc}$, the source of M35 is connected to the drain of M36, and the gates of M35 and M36 and the source of M36 is connected to $V_{ss}$.

The circuit 44 supplies a compensation signal VCCREF which remains at a relatively constant 1.5 volts over a wide variation in $V_{cc}$, e.g., as $V_{cc}$ varies from 4 to 6 volts. The devices M35 and M36 are always in the conductive state. The physical dimensions of the p-channel transistor devices M35 and M36 are such that M35 drives relatively weaker and has a correspondingly higher resistance as compared in M36, such that VCCREF, taken at the M36 drain, is always at about one p-channel device threshold old voltage (about 1.2 volts) plus a small resistance voltage drop (about 0.3 volts) above $V_{ss}$, or about 1.5 volts, irrespective of the supply voltage level. To achieve this, by way of example, the width-to-length ratio of device M36 can be selected to be quite large, in the range of 10 to 100, which the aspect ratio of M35 is quite small, in the range of 0.1 to 1.0. Of course, other circuit techniques for achieving this relatively constant compensation signal VCCREF over supply variations may be employed.

The compensation signal VCCREF drives the gate of M10 (FIG. 2), and effectively modulates the reference signal VRFOB in order to minimize the $V_{cc}$ variation in the output circuit current sinking capability. As the supply $V_{cc}$ increases, the compensation signal VCCREF increases the drive on M10 by a larger amount than would be obtained by simply tying its gate to ground, as in U.S. Pat. No. 4,723,108. This results in pulling the reference signal VRFOB up higher as the supply $V_{cc}$ increases.

This operation occurs in the following manner. At a high supply potential, say 6 volts, the gate-drain voltage on M15 is 1.5 volts (VCCREF) minus 6 volts or about $-4.5$ volts. At low supply potentials, say 4 volts, the gate-drain potential difference on M15 is only 1.5 volts minus 4 volts, or $-2.5$ volts. On the other hand, if the gate of M15 were simply tied to ground, as in the '108 patent, the gate-drain potential difference variation would be from $-4$ volts to $-6$ volts. Thus, the percentage variation on the M10 drive is much greater using VCCREF to provide the M10 gate potential. Device M11 acts as a level-shifter. At high $V_{cc}$ levels, the VRFOB is driven much closer to the supply $V_{cc}$ than if the M10 gate were ties to ground, thereby providing supply compensation by reducing sensitivity in the output current I2.

MOS device M31 is included in the VRFOB pull-down path between the source of M12 and $V_{ss}$. The gate of M31 is connected to $V_{cc}$. M31 provides additional supply compensation in the following manner. As $V_{cc}$ increases, the drain-to-source resistance of both devices M12 and M31 will decrease. However, because the gate of M31 is connected to $V_{cc}$ its resistance decreases less than does the resistance of M12, thus providing additional supply compensation, since VRFOB is not pulled down as hard as if M31 were not in the circuit. M31 also provides some process compensation in the pull-down path.

Compensation for slow changes in the supply voltage is provided by circuit 44, as well as the devices M10 and M11 and M31. In accordance with the invention, the circuit 40 further comprises a p-channel transistor device M34, whose source and drain are both connected to $V_{cc}$. The gate of M34 is connected to node 4, the node at which the reference voltage signal VRFOB is established. Compensation for fast changing supply conditions is provided by device M34, which acts as a capacitor to the supply $V_{cc}$, so that as the supply $V_{cc}$ moves quickly, so will the signal VRFOB, maintaining the same voltage relative to the supply voltage $V_{cc}$.

The reference signal VRFOB is supplied to each output circuit, as illustrated in FIG. 4, where exemplary output circuit 28 is illustrated, and provides an output signal in response to the output data signal ROUTB and the output enable signal OE. Each output circuit includes a true and a compliment signal generator, each comprising a CMOS inverter circuit in series with a p-channel transistor device. Thus, the inverter comprising M38 and M39 is connected in series with p-channel transistor M37 and a resistor between $V_{cc}$ and $V_{ss}$. The inverter comprising M41 and M42 is connected in series with p-channel device M40 and a resistor between $V_{cc}$ and $V_{ss}$. The respective gates of devices M37 and M40 are connected to VRFOB. The output of the true signal generator is connected to the gate of M43. The output of the complement generator is connected to the gate of M44. For either output signal state, one of the devices M43 and M44 will be conductive, and the other will be non-conductive to either pull the output signal level up toward $V_{cc}$ or down toward $V_{ss}$.

The p-channel devices M37 and M40 serve to modulate the current flow when the inverters comprising circuit 28 switch from one logical state to the other, and thereby control the output buffer transition speed. The higher the current flow, the faster will the output signal change state. Thus, the devices M37 and M40 serve to modulate the current sinking capability of the output circuit 28.

In some special situations, a particular integrated circuit device may be especially sensitive to noise. For example, if the device is an EPROM, high programming voltages may be applied during programming procedures. The high voltage gets amplified by the noise and can cause destructive device failures. Also, the device, or the hardware in which the device is installed, may be particularly sensitive to noise during testing procedures. The circuit 40 further comprises circuitry for further slowing down the output transition rate in such special situations. The circuitry comprises devices M30 and M32 and inverter 48. A high signal BR is applied to the gate of device M30 and to the inverter 48 to activate this feature. When BR goes high, VRFOB is changed (increased) so as to slow down the outputs significantly to further reduce noise. Device M30 is turned on to the conductive state, pulling down the gate of M12, decreasing the gate drive on M12 and thereby increasing the voltage drop across M12 and decreasing the current 12. This causes less of a voltage drop across M10 and M11, resulting in pulling VRFOB closer to $V_{cc}$. Also, the output of the inverter 48 goes low, turning on M32, shorting out the effect of M10, pulling VRFOB up closer to $V_{cc}$. As a result the output transition time of the device 10 is substantially increased, in this example by a factor of 10. When BR is low, the devices M30 and M32 are not conductive and, therefore, do not affect the operation of the circuit.

The circuit further provides the temperature and process compensation described above, tending to reduce the current sinking capability as the temperature decreases or if the device circuits operate at higher speed due to process variations.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. In an MOS integrated circuit device which receives a supply voltage and is characterized by at least one output circuit which drives an output terminal with an output signal, the output circuit characterized by a current sinking capability and by a state switching speed, a compensation circuit for compensating for supply voltage variations, comprising:

circuit means for generating a supply compensation signal which is not at ground and which does not increase as the supply voltage increases, and means for generating a reference voltage signal, such that said reference signal varies in dependence on the supply voltage, whereby said reference voltage signal rises as the supply voltage rises, and become smaller as the supply voltage drops, said reference voltage signal generator means responsive to said supply compensation signal and said supply voltage to vary a gate drive on a first MOS transistor device characterized by a gate; and output circuit current modulating means responsive to said reference signal for modulating the current sinking capability of said output circuit, to reduce the current sinking capability as the reference signal increases and thereby reducing the output circuit state switching speed, and conversely increasing the current sinking capability as the reference signal decreases, thereby increasing the output circuit state switching speed.

2. The compensation circuit of claim 1 wherein said MOS transistor device has a source, a drain coupled to the supply voltage, and said gate connected to said supply compensation signal, and wherein the supply compensation signal is substantially fixed with respect to supply voltage variations, wherein said gate drive on said MOS transistor device is modulated by the supply voltage level such that the transistor drive is increased as the supply voltage increases, and the transistor drive is decreased as the supply voltage decreases.

3. The compensation circuit of claim 2 wherein said circuit means comprises means for compensating for slowly varying changes in the supply voltage.

4. The compensation circuit of claim 2 wherein said circuit means comprises a second MOS transistor device coupled in series with said first MOS transistor device, such that drain-to-source current through said first device also flows through said second MOS transistor device, and an integrated resistor device in series with said second MOS transistor device, whereby the reference voltage signal comprises the voltage drop across the resistor and the drain-to-source voltage drop of the second MOS transistor device, and further comprising means for modulating the gate drive of said second MOS transistor device to compensate for temperature variations experienced by said integrated circuit device, whereby said reference voltage signal is compensated for variations in supply and temperature.

5. The compensation circuit of claim 4 wherein the reference voltage signal is developed at a reference node, and further comprising a third MOS transistor device coupled in series with said second MOS transistor device, said third MOS transistor device having a gate connected to the supply voltage, said second and third MOS transistor devices being disposed in a pull-down path for said reference node and being characterized by respective drain-source resistances, and whereby the drain-source resistance of the third MOS device increases at a slower rate with increasing supply voltage than does the drain-source resistance of the second MOS device, thereby providing supply compensation in said pull-down path.

6. The compensation circuit of claim 2 wherein said means for generating a substantially fixed supply compensation signal comprises second and third MOS transistor devices, each having a source, drain and gate, the drain of the second device coupled to the supply, the source of the second device coupled to the drain of the third device, and the source of the third device coupled to the device $V_{ss}$ potential, and the gates of the second and third devices are connected to $V_{ss}$, and wherein the geometries of the second and third devices are selected such that (the drain-source voltage drop) of the third device is substantially constant as the supply voltage varies, and wherein the drain-source voltage drop of the third device establishes said reference voltage signal.

7. The compensation circuit of claim 1 wherein said reference circuit comprises means for compensating for rapidly changing supply voltage conditions, and said circuit means establishes said reference voltage signal at a reference node, and said circuit means comprises means for capacitively coupling said supply to said reference node, whereby as said supply voltage changes, the reference voltage changes with it.

8. The compensation circuit of claim 7 wherein said capacitive coupling means comprises an MOS transistor device having a source and a drain connected to the supply voltage, and a gate connected to said reference node.

9. The compensation circuit of claim 1 further comprising circuit means for selectively reducing the output circuit current sinking capability in response to an enable signal, thereby selectively increasing the output circuit state switching speed in response to the enable signal.

10. The compensation circuit of claim 9 wherein said circuit means comprises a second MOS transistor device selectively operable in a conductive state and gated to the conductive state in response to the enable signal to selectively bypass the first MOS transistor device.

11. In an MOS integrated circuit device which receives a supply voltage and is characterized by at least one output circuit which drives an output terminal with an output signal, the output circuit characterized by a current sinking capability and by a state switching speed, a compensation circuit for compensating for supply voltage variations, comprising:

circuit means for generating a supply reference voltage signal at a reference node, such that said reference signal varies in dependence on the supply voltage, whereby said reference voltage signal rises as the supply voltage rises, and becomes smaller as the supply voltage drops;

means for compensating for rapidly varying supply voltage conditions, said compensating means comprising circuit means for capacitively coupling said reference node to the supply voltage, whereby as the supply voltage changes rapidly, the reference voltage signal changes with it; and output circuit current modulating means responsive to said reference signal for modulating the current sinking capability of said output circuit, to reduce the current sinking capability as the reference signal increases and thereby reducing the output circuit state switching speed, and conversely increasing the current sinking capability as the reference signal decreases, thereby increasing the output circuit state switching speed.

12. The compensation circuit of claim 11 wherein said capacitive coupling means comprises an MOS transistor device having a source and a drain each connected to the supply voltage, and a gate connected to said reference node.

* * * * *